United States Patent
Franz et al.

(10) Patent No.: US 9,234,927 B2
(45) Date of Patent: Jan. 12, 2016

(54) MEASURING INSTRUMENT AND MEASURING METHOD FEATURING DYNAMIC CHANNEL ALLOCATION

(75) Inventors: Stefan Franz, Munich (DE); Martin Leibfritz, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1087 days.

(21) Appl. No.: 13/266,117

(22) PCT Filed: Feb. 10, 2010

(86) PCT No.: PCT/EP2010/000810
§ 371 (c)(1),
(2), (4) Date: Jan. 17, 2012

(87) PCT Pub. No.: WO2010/121681
PCT Pub. Date: Oct. 28, 2010

(65) Prior Publication Data
US 2012/0112985 A1  May 10, 2012

(30) Foreign Application Priority Data

Apr. 24, 2009  (DE) .......................... 10 2009 018 788

(51) Int. Cl.
*G01R 27/28* (2006.01)
*G01R 1/02* (2006.01)

(52) U.S. Cl.
CPC ................ *G01R 27/28* (2013.01); *G01R 1/025* (2013.01)

(58) Field of Classification Search
CPC ................................ G01R 27/28; G01R 1/025
USPC .................................................... 324/115, 142
See application file for complete search history.

(56) References Cited

U.S. PATENT DOCUMENTS

| | | | |
|---|---|---|---|
| 5,225,816 A | 7/1993 | Lebby et al. | |
| 5,321,420 A | 6/1994 | Rezek et al. | |
| 6,271,654 B1 * | 8/2001 | Chen | 324/115 |
| 6,437,552 B1 | 8/2002 | Sekel et al. | |
| 6,675,650 B1 * | 1/2004 | Paulo | 73/491 |
| 2003/0036872 A1 | 2/2003 | Stark | |

FOREIGN PATENT DOCUMENTS

| | | |
|---|---|---|
| DE | 102004033940 A1 | 2/2006 |
| DE | 102006023914 A1 * | 11/2007 |
| DE | 102006023914 A1 | 11/2007 |
| DE | 60219581 T2 | 1/2008 |
| JP | 2000-28651 A | 1/2000 |

OTHER PUBLICATIONS

International Preliminary Report on Patentability for PCT Application No. PCT/EP2010/000810 dated Dec. 15, 2011, pp. 1-7.

* cited by examiner

*Primary Examiner* — Ilana Spar
(74) *Attorney, Agent, or Firm* — Ditthavong & Steiner, P.C.

(57) ABSTRACT

A measuring device including a control device, at least two ports, at least two measurement channels and at least two display devices. The control device assigns ports to the measurement channels and connects the measurement channels to these ports internally, at least logically. In this context, one display device is assigned to every port. The display devices allocated to the ports display information, which relates to the present assignment and/or utilization of the respective ports.

20 Claims, 4 Drawing Sheets

MEASURING INSTRUMENT AND MEASURING METHOD FEATURING DYNAMIC CHANNEL ALLOCATION

CROSS-REFERENCE TO RELATED APPLICATION

The present application is a national phase application of PCT Application No. PCT/EP2010/000810, filed on Feb. 10, 2010, and claims priority to German Patent Application No. DE 10 2009 018 778.2, filed on Apr. 24, 2009, the entire contents of which are herein incorporated by reference.

BACKGROUND OF THE INVENTION

1. Field of the Invention

The invention relates to a measuring device, of which the measurement channels are dynamically assigned to its ports, and a corresponding measuring method.

2. Discussion of the Background

A vectorial network analyzer is conventionally used to determine the scattering parameters of a device under test. The ports for the test signals are generally allocated to the measurement channels on such a measuring device in a fixed manner. The allocation is identified by labelling the ports on the housing of the measuring device.

However, with this fixed allocation, it is disadvantageous that the user of the measuring device must match a measuring task to be implemented with the allocation. This means that, under some circumstances, the user must take into account a more complex wiring, in order to perform the measuring task. Alternatively, the user is forced to convert the determined scattering parameters into a required form.

Regarding the technical background, DE 10 2006 023 914 A1 discloses an oscilloscope with a fixed allocation of the ports to measurement channels with a preview display.

SUMMARY OF THE INVENTION

The invention advantageously provides a measuring device and a measuring method, which allow great flexibility with regard to the connection of the device under test, without requiring costly, retrospective calculations.

A measuring device according to the invention comprises a control device, at least two ports, at least two measurement channels and at least two display devices. The control device assigns ports to the measurement channels and connects the measurement channels internally, at least logically, to these ports. A display device is allocated here to each port. The display devices allocated to the ports display information relating to the present assignment and/or utilisation of the respective ports. Accordingly, a very simple connection of a device under test is possible.

Each port and the allocated display device are preferably disposed in close spatial proximity. Accordingly, a simple allocation of each display device to the port is guaranteed for the user. Simple operation is achieved in this way.

At least two display devices are preferably combined to form a display unit. The display unit is preferably allocated to at least two ports. This therefore reduces the manufacturing costs for the measuring device.

The display devices advantageously display information through color coding and/or through pattern. This further simplifies intuitive operability.

The display devices are preferably each embodied in an annular shape around the allocated ports. A very good allocation of the display devices to the ports is achieved in this manner.

The information displayed by the display devices advantageously indicates measurement channels of the measuring device assigned to the allocated ports. The allocation of the measurement channels and ports is, therefore, clearly visible.

The information displayed by the display devices preferably relates to calibrations of the allocated ports. The information displayed by the display devices advantageously indicates implemented calibrations of the allocated ports and/or types of implemented calibrations. A user can therefore readily identify whether a calibration for a determined measurement is already present.

The information displayed by the display devices preferably characterises signals output by means of the ports. The information displayed by the display devices advantageously indicates frequencies and/or powers of signals output by means of the ports. This guarantees a clear and simple connection of a device under test.

BRIEF DESCRIPTION OF THE DRAWINGS

The invention is described below by way of example with reference to the drawings, in which advantageous exemplary embodiments of the invention are shown. The drawings are as follows.

DETAILED DESCRIPTION OF EXEMPLARY EMBODIMENTS OF THE INVENTION

Figure 3:
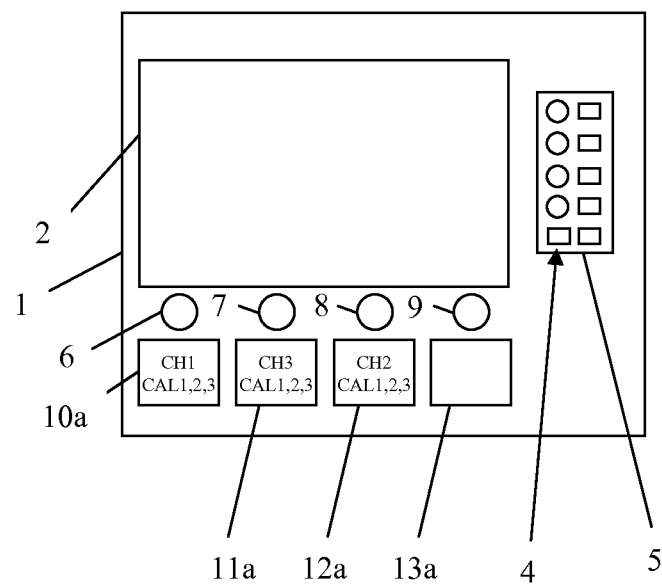
FIG. 3 shows a first exemplary embodiment of the display of the measuring device according to the invention.
Figure 4:
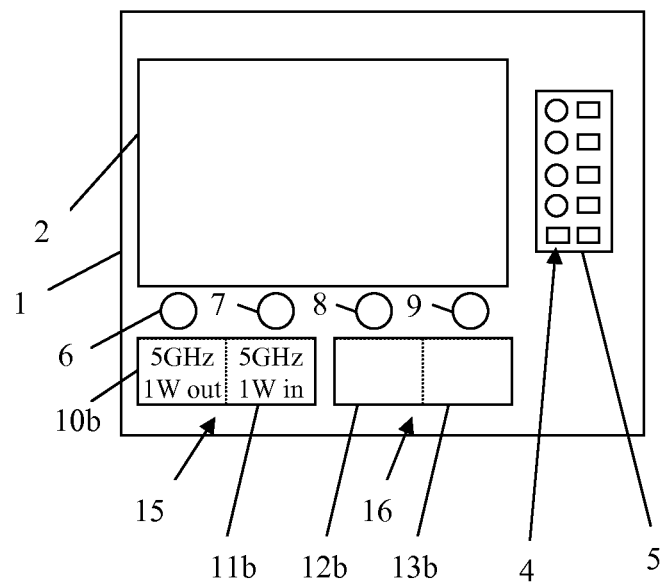
FIG. 4 shows a second exemplary embodiment of the display of the measuring device according to the invention.
Figure 5:
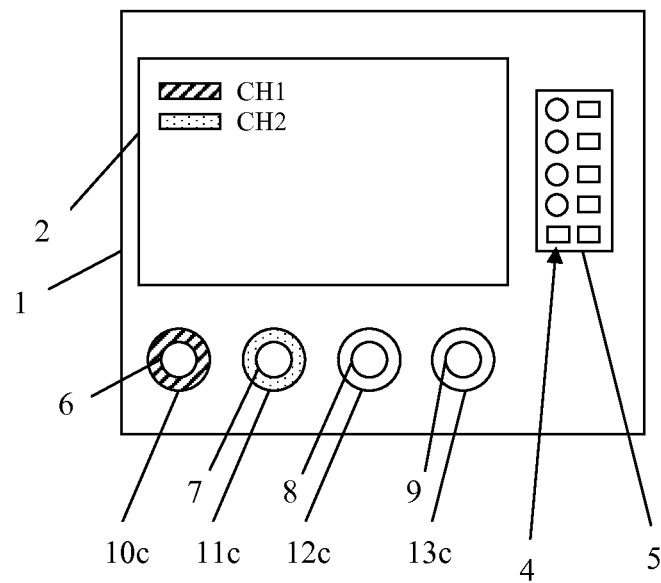
FIG. 5 shows a third exemplary embodiment of the display of the measuring device according to the invention.

Firstly, the structure and the method of functioning of an exemplary measuring device are explained with reference to FIG. 1. An exemplary embodiment of the measuring device according to the invention is then illustrated by means of FIG. 2. With reference to FIGS. 3 to 5, the structure and method of functioning of different display devices are visualised on the basis of several exemplary embodiments of the measuring device according to the invention. Finally, the method of functioning of an exemplary embodiment of the measuring method according to the invention is shown with reference to FIG. 6. The presentation and description of identical elements in similar drawings has in some cases not been repeated.

Figure 1:
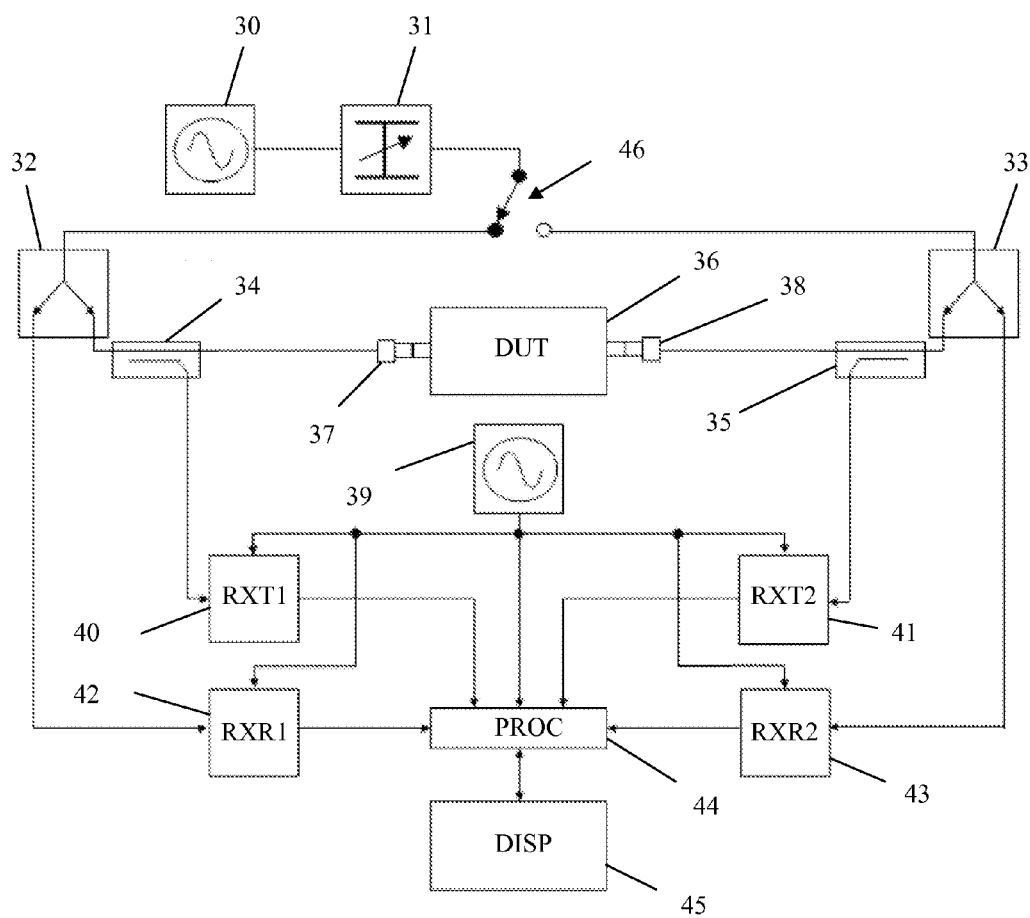
FIG. 1 shows a block-circuit diagram of a network analyzer usable in connection with the invention.

FIG. 1 shows a block-circuit diagram of a network analyzer usable in connection with the invention. The exemplary measuring device shown here is a vectorial network analyzer. A signal generator 30 is connected to a level adjustment device 31. The level adjustment device 31 is connected to a switch 46. The switch 46 is connected to a first signal distributor 32 and a second signal distributor 33. The signal distributors 32, 33 are each connected to a directional coupler 34, 35 and a reference receiver 42, 43. The directional couplers 34, 35 are each connected to a port 37, 38. A device under test 36 is connected by means of the ports 37, 38. The test receivers 40, 41 are further connected to the directional couplers 34, 35. A local oscillator 39 is connected to the test receivers 40, 41 and the reference receivers 42, 43. The test receivers 40, 41 and the reference receivers 42, 43 are connected to a processing device 44. The processing device 44 is further connected to a display device 45.

To implement a measurement with the vectorial network analyzer, a calibration must first be performed. For this purpose, several calibration standards are terminated one after the other in place of the device under test 36. While each calibration standard is connected, a calibration measurement is implemented. Here, the signal generator 30 supplies the calibration standard with a signal. The signal generated by the signal generator 30 is matched in its level by the level adjustment device 31. The switch 46 conducts the signal via one of the signal distributors 32, 33 and one of the directional couplers 34, 35 to one of the ports 37, 38, to which the calibration standard is connected. In the example shown here, the signal supplied by the signal generator 30 is transmitted from the switch 46 to the signal distributor 32 and via the directional coupler 34 to the port 37. A part of the signal is reflected by the calibration standard and transmitted from the directional coupler 34 to the test receiver 40. Provided the calibration standard is a transmissive calibration standard, a part of the test signal is output at the port 38 and transmitted from the directional coupler 35 to the test receiver 41. The test receivers 40, 41 are supplied with a reference signal by the local oscillator 39. The test receivers 40, 41 mix each received test signal with the reference signal, digitize it, and relay it to the processing device 44.

The signal generated by the signal generator 30 is then conducted from the signal distributor 32 to the reference receiver 42. The reference receiver 42 also receives a reference signal from the local oscillator 39. Like the test receivers 40, 41, the reference receiver 42 also mixes the reference signal with the test signal and digitizes the resulting signal. It also relays it to the processing device 44.

In the case of the dual-port calibration shown here, the measurement is repeated for each calibration standard in both signal directions, that is, both switch positions of the switch 46. These measurements are subsequently repeated for several calibration standards. A calibration of the vectorial network analyzer is implemented by means of the calibration measurements.

The vectorial network analyzer shown here comprises only two ports, which correspond to the two connections 37, 38. If a calibration is implemented using a transmissive calibration standard, both ports of the vectorial network analyzer are calibrated together. This means that measurements of transmissive devices under test are possible with a very small error. If only a single calibration was implemented by means of a non-transmissive calibration standard (single port calibration) the ports of the vectorial network analyzer are not calibrated together. Only measurements of reflexive devices under test can be implemented with a small error. However, in this case, a repetition of measurements with different signal directions is also not necessary.

If a network analyzer with a large number of test ports, for example, 4 test ports, is to be completely calibrated, a repetition of the measurements for two signal directions is not sufficient. On the contrary, all possible signal directions between the test ports must be calibrated. One type of application with more than two used test ports is described in greater detail with reference to FIG. 3.

The measurement of a device under test 36 is implemented in a similar manner to the calibration measurement shown. The determined measurement results are corrected by means of a correction calculation. The results of the calibration measurements are used for this correction calculation. The results of the correction calculation are displayed by the processing device 44 on the display device 45.

According to the invention, measuring devices with an arbitrary number of test ports are used.

Figure 2:
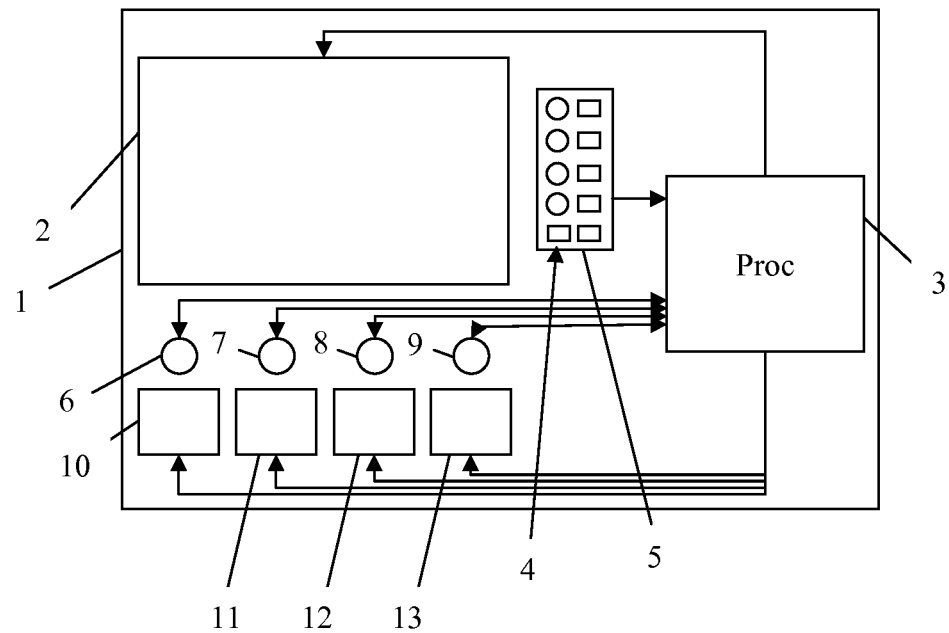
FIG. 2 shows an exemplary embodiment of a block-circuit diagram of the measuring device according to the invention.

FIG. 2 shows a block-circuit diagram of an exemplary embodiment of the measuring device according to the invention. A housing 1 contains a first display device 2, a processing device 3, several ports 6, 7, 8, 9, and several second display units 10, 11, 12, 13. Furthermore, the housing 1 contains an input device 5 with several operating elements 4. Here, the processing device 3 is connected to the first display device 2, the second display devices 10 to 13, the input device 5 and the ports 6 to 9.

A device under test is connected to the measuring device through at least one of the ports 6 to 9. The processing device 3 assigns the individual ports 6 to 9 to the measurement channels. Here, the assignment of the measurement channels is optionally shown by the processing device 3 on the second display devices 10 to 13. Furthermore, the processing device 3 controls the measurement process. A user inputs information related to the measurement, for example, the type of measurement to be implemented, through the input device 5. The processing device 3 displays results of the measurement on the first display device 2. The information displayed on the second display devices 10 to 13 is described in greater detail with reference to FIGS. 2 to 4.

FIG. 3 shows a first exemplary embodiment of the display of the measuring device according to the invention. The presentation largely corresponds with the presentation from FIG. 2. However, only a front view of the measuring device according to the invention is shown here. The processing device 3 from FIG. 1 is located in the interior of the measuring device according to the invention and is therefore not shown here. Moreover, the connections of the individual elements are made on the rear side and are not shown here.

In the measuring task shown here, a first measurement channel is assigned to the port 6. A third measurement channel is assigned to the port 7. A second measurement channel is assigned to the port 8. The display device 10a is assigned to the first port 6. The display device 11a is assigned to the second port 7. The display device 12a is assigned to the third port 8. The assignment of the channels to each port is shown on the display device allocated in each case. The first display device 10a accordingly displays the abbreviation CH1, while the second display device 11a displays the abbreviation CH3. The third display device 12a displays the abbreviation CH2. If difficulties arise for the user from connecting the cables to the ports 6, 7, 8 of the measuring device according to the invention, the user can readily perform a re-assignment of the channels to other ports.

The display devices 10a, 11a, 12a also display a calibration status. For example, a calibration of the ports 6, 7 and 8 was implemented in each case with all of the other assigned ports 6, 7 and 8. Accordingly, the abbreviation CAL1,2,3 is displayed by the display device. If a calibration of all four ports had been implemented, an abbreviation CAL1-4 would be displayed in all display devices 10a, 11a, 12a, 13a. If just a single port calibration had been implemented, the abbreviations could then be CAL1, CAL2 or CAL3. Alternatively or additionally, a display of the direction of the implemented calibration is possible. An abbreviation CAL21 could therefore be displayed, for example, for a calibration only in a forward direction. A display of the type of implemented calibration is also possible, that is, a display of the type of the calibration standard and/or of the calibration method used.

Already implemented calibrations for the different ports and assignments are buffered by the processing device 3 from FIG. 1. If a port or a combination of ports is used again, the buffered calibration is used, provided a re-calibration is not required.

FIG. 4 shows a second exemplary embodiment of the display of the measuring device according to the invention. This presentation also largely corresponds to the presentations in FIG. 2 and FIG. 3. The display devices 10b, 11b are however combined here into a common display unit 15. Similarly, display devices 12b and 13b are combined into a common display unit 16. In this manner, the measuring device can be constructed using a smaller number of independent display devices. The manufacturing cost can be reduced accordingly.

By means of display devices 10b, 11b and in contrast to FIG. 2 the assignment of the channels and the calibration status is not shown here, but instead the function of the respective ports 6, 7. Accordingly, port 6 is used in this exemplary embodiment for the output of a test signal with a frequency of 5 GHz and an output power of 1 W. The port 7 is used in this exemplary embodiment for the measurement of a test signal with a frequency of 5 GHz with a maximum permitted reception power of 1 W. Alternatively, the currently measured power can be displayed. These displays guarantee a simple and clear connectivity of the device under test. A linking of two ports at the transmitting end and/or the receiving end of a differential measurement can also be displayed on the display devices 6, 7, 8, 9. A frequency range of an output sweep signal or a frequency range measured from a port can be displayed. Furthermore, the display devices can be used to display a voltage output or measured by the respective port or a corresponding current, for example, if the network analyzer is operated with a bias-T.

FIG. 5 shows a third exemplary embodiment of the display of the measuring device according to the invention. This presentation also largely corresponds to the presentations in FIGS. 2 to 4. The display devices 10c to 13c however differ considerably here from the display devices in FIGS. 2 to 4. The display devices 10c to 13c accordingly comprise annular structures, which are arranged directly around the ports 6 to 9. The display devices 10c to 13c can each display a color and/or a pattern. Only by means of display device 2 can the assignment be directly identified. Accordingly, a key to the colors and/or patterns of display devices 10c to 13c with their respective meanings is shown on display device 2. Alternatively, a presentation of possible measuring curves and signals in the color and/or with the pattern of the display devices 10c to 13c on display device 2 is also conceivable. This means that display devices 10c to 13c each display a color and/or a pattern, which is also used to display a signal which is measured or output by the relevant port 6 to 9 on display device 2.

Figure 6:
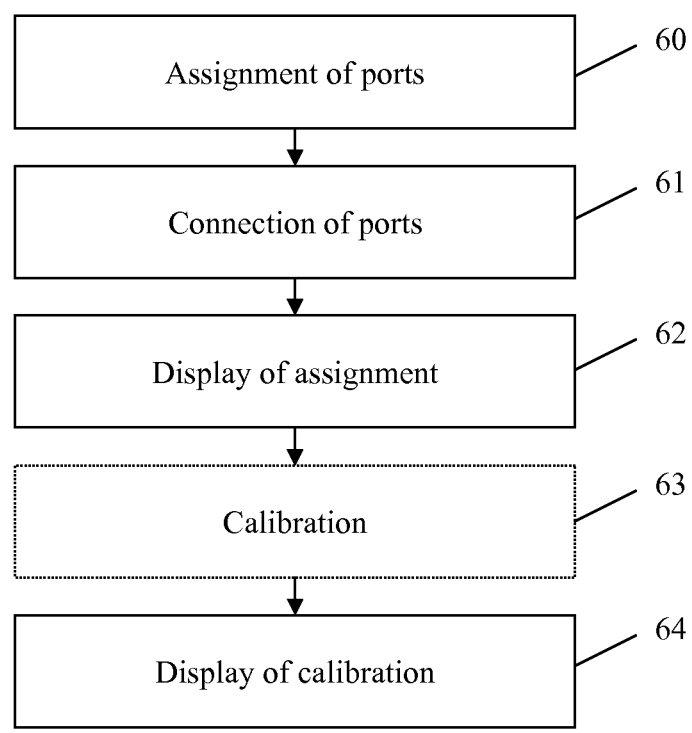
FIG. 6 shows an exemplary embodiment of the flow chart of the measuring method according to the invention.

FIG. 6 shows an exemplary embodiment of the measuring method according to the invention. Starting from an arbitrary calibration status of the measuring device, the assignment of the ports used to the measurement channels of the measuring device takes place in a first step 60. Here, the sequence of ports necessary to obtain a scattering matrix of the device under test is taken into consideration as a result of the measurement. In a second step 61, the ports are connected at least logically to the allocated measurement channels of the measuring device. The connection can be made physically here by means of switches. Alternatively, the connection is implemented through software. This means it is specified which measurement channels and/or reference channels are selected and displayed.

The assignment of the ports to the measurement channels is displayed in a third step 62 by means of display devices, which are arranged in the immediate proximity of the ports.

If a necessary calibration, for example, a transmissive calibration, for the chosen assignment of the ports to the measurement channels, has not yet been carried out, this is implemented in an optional fourth step 63. In this manner, a calibration measurement is achieved by connecting one or more calibration standards to the ports. By preference, several consecutive calibration measurements are undertaken on different calibration standards. A display on the display devices of each of the calibration standards to be connected is also possible here.

In a fifth step 64, the calibration status of the ports is shown by means of the display devices arranged in the proximity of the ports. This allows a presentation of the subsequent calibration of a port, as well as a presentation of the type of calibration implemented. If, for instance, a transmissive calibration of ports 1 and 2 is implemented, the abbreviation CAL1,2 would be shown on both of the display devices.

The invention is not limited to the exemplary embodiment presented. Accordingly, any information relating to the respectively allocated ports can be shown by the display devices. A combination of more than two display devices with display units is also conceivable. All of the features described above or features shown in the drawings can be advantageously combined with one another as required within the scope of the invention.

The invention claimed is:

1. A measuring device comprising:
a control device,
at least two ports,
at least two measurement channels,
a first display device configured to display results of measurements,
wherein the control device assigns ports to the measurement channels and connects the measurement channels to these ports internally,
at least two second display devices, wherein precisely one second display device is allocated to every port,
wherein the second display devices allocated to the ports display information relating to a present assignment and/or utilization of the respective ports,
wherein, when difficulties arise from connecting the measurement channels to assigned ports, a user can operate the control device to re-assign other ports to the measurement channels, and
wherein the first display device and the second display devices are not identical.

2. The measuring device according to claim 1,
wherein the respective port and the allocated display device are disposed in direct spatial proximity.

3. The measuring device according to claim 1,
wherein at least two display devices are combined to form a display unit, and wherein the display unit is allocated to at least two ports.

4. The measuring device according to claim 1,
wherein the display devices display information through color coding and/or through pattern.

5. The measuring device according to claim 1,
wherein the display devices are embodied respectively in an annular shape around the allocated ports.

6. The measuring device according to claim 1,
wherein the information displayed by the display devices displays measurement channels of the measuring device assigned to the allocated ports.

7. The measuring device according to claim 1,
wherein the information displayed by the display devices relates to calibrations of the allocated ports.

8. The measuring device according to claim 1,
wherein the information displayed by the display devices displays implemented calibrations of the allocated ports and/or types of implemented calibrations.

9. The measuring device according to claim 1,
wherein the information displayed by the display devices characterizes signals output by the ports.

10. The measuring device according to claim 1,
wherein the information displayed by the display devices displays frequencies and/or powers of signals output by the ports.

11. The measuring device according to claim 2,
wherein at least two display devices are combined to form a display unit, and wherein the display unit is allocated to at least two ports.

12. The measuring device according to claim 2,
wherein the display devices display information through color coding and/or through pattern.

13. The measuring device according to claim 2,
wherein the display devices are embodied respectively in an annular shape around the allocated ports.

14. A measuring method using a measuring device with at least two ports, and at least two measurement channels, wherein the method comprises:
assigning of ports to measurement channels;
internally connecting of the ports and of the assigned measurement channels,
providing a first display device configured to display results of measurements,
providing at least two second display devices, wherein precisely one second display device is allocated to every port,
displaying of measured results by the first display device,
displaying of information by the second display devices allocated to the ports, which information displays a present assignment and/or utilization of the respective ports, and
re-assigning other ports to the measurement channels, when difficulties arise from connecting the measurement channels to assigned ports,
wherein the first display device and the second display devices are not identical.

15. The measuring method according to claim 14,
wherein the information from the display devices is displayed through color coding and/or through pattern.

16. The measuring device according to claim 15,
wherein information which displays measurement channels of the measuring device allocated to the assigned ports is displayed by the display devices.

17. The measuring method according to claim 14,
wherein information which relates to calibrations of the allocated ports is displayed by the display devices.

18. The measuring method according to claim 14,
wherein information which characterizes signals output by the ports is displayed by the display devices.

19. The measuring device according to claim 16,
wherein information which displays measurement channels of the measuring device allocated to the assigned ports is displayed by the display devices.

20. The measuring method according to claim 15,
wherein information which relates to calibrations of the allocated ports is displayed by the display devices.

* * * * *